US007416972B2

United States Patent
Japp et al.

(10) Patent No.: US 7,416,972 B2
(45) Date of Patent: Aug. 26, 2008

(54) METHOD OF MAKING SAME LOW MOISTURE ABSORPTIVE CIRCUITIZED SUBSTRAVE WITH REDUCED THERMAL EXPANSION

(75) Inventors: Robert M. Japp, Vestal, NY (US); Irving Memis, Vestal, NY (US); Kostas I. Papathomas, Endicott, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/730,942

(22) Filed: Apr. 5, 2007

(65) Prior Publication Data

US 2007/0182016 A1    Aug. 9, 2007

Related U.S. Application Data

(60) Division of application No. 11/086,323, filed on Mar. 23, 2005, which is a continuation-in-part of application No. 10/812,890, filed on Mar. 31, 2004, now Pat. No. 7,078,816.

(51) Int. Cl.
*H01L 21/4763* (2006.01)
(52) U.S. Cl. .................. 438/624; 438/622; 438/623; 257/762
(58) Field of Classification Search .......... 257/762; 438/624, 687, 623, 118, 622
See application file for complete search history.

(56) References Cited

U.S. PATENT DOCUMENTS

| 3,767,756 | A |   | 10/1973 | Blades |
| 3,869,429 | A |   | 3/1975  | Blades |
| 3,869,430 | A |   | 3/1975  | Blades |
| 3,953,566 | A |   | 4/1976  | Gore |
| 4,187,390 | A |   | 2/1980  | Gore |
| 4,482,516 | A |   | 11/1984 | Bowman et al. |
| 4,729,921 | A |   | 3/1988  | Tokarsky |
| 5,073,456 | A | * | 12/1991 | Palladino ............... 428/446 |
| 5,103,293 | A |   | 4/1992  | Bonafino et al. |
| 5,246,817 | A |   | 9/1993  | Shipley, Jr. |
| 5,314,742 | A |   | 5/1994  | Kirayoglu et al. |
| 5,418,689 | A |   | 5/1995  | Alpaugh et al. |
| 5,652,055 | A |   | 7/1997  | King et al. |
| 6,207,595 | B1 |  | 3/2001  | Appelt et al. |
| 6,323,436 | B1 |  | 11/2001 | Hedrick et al. |
| 6,528,145 | B1 | * | 3/2003 | Berger et al. ............ 428/156 |
| 2004/0031147 | A1 | | 2/2004 | Kawashima et al. |

* cited by examiner

*Primary Examiner*—David Vu
*Assistant Examiner*—Thinh T Nguyen
(74) *Attorney, Agent, or Firm*—Hinman, Howard & Kattell; Lawrence R. Fraley; Mark Levy (57) ABSTRACT

A method of making a circuitized substrate including a composite layer including a first dielectric sub-layer including a plurality of fibers having a low coefficient of thermal expansion and a second dielectric sub-layer of a low moisture absorptivity resin, the second dielectric sub-layer not including continuous or semi-continuous fibers or the like as part thereof. The substrate further includes at least one electrically conductive layer as part thereof.

4 Claims, 3 Drawing Sheets

METHOD OF MAKING SAME LOW MOISTURE ABSORPTIVE CIRCUITIZED SUBSTRAVE WITH REDUCED THERMAL EXPANSION

CROSS REFERENCE TO CO-PENDING APPLICATIONS

The application is a divisional application of Ser. No. 11/086,323, filed Mar. 23, 2005 and entitled "LOW MOISTURE ABSORPTIVE CIRCUITIZED SUBSTRATE WITH REDUCED THERMAL EXPANSION, METHOD OF MAKING SAME, ELECTRICAL ASSEMBLY UTILIZING SAME, AND INFORMATION HANDLING SYSTEM UTILIZING SAME", which is a continuation-in-part application of Ser. No. 10/812,890, entitled "CIRCUITIZED SUBSTRATE, METHOD OF MAKING SAME, ELECTRICAL ASSEMBLY UTILIZING SAME, AND INFORMATION HANDLING SYSTEM UTILIZING SAME", filed Mar. 31, 2004. Ser. No. 10/812,890 is now U.S. Pat. No. 7,078,816.

In Ser. No. 10/920,235, entitled "LOW MOISTURE ABSORPTIVE CIRCUITIZED SUBSTRATE, METHOD OF MAKING SAME, ELECTRICAL ASSEMBLY UTILIZING SAME, AND INFORMATION HANDLING SYSTEM UTILIZING SAME", filed Jul. 18, 2004, there is defined a circuitized substrate comprising a first layer comprised of a dielectric material including a low moisture absorptive polymer resin in combination with a nodular fluoropolymer web encased within the resin, the resulting dielectric layer formed from this combination not including continuous or semi-continuous fibers as part thereof. The substrate further includes at least one circuitized layer positioned on the dielectric first layer. An electrical assembly and a method of making the substrate are also provided, as is an information handling system (e.g., computer) incorporating the circuitized substrate of the invention as part thereof. The dielectric material taught in Ser. No. 10/920,235 thus represents an improved material for substrates of the type defined in Ser. No. 10/812,890. As defined herein, the instant invention represents yet another improvement to such substrates. Ser. No. 10/920,235 is now U.S. Pat. No. 7,145,221.

TECHNICAL FIELD

This invention relates to circuitized substrates and particularly to those used in multilayered circuit boards, chip carriers, and the like, and to processes for manufacturing same. More particularly, the invention relates to substrates used in such final products so as to provide same with increased circuit density.

BACKGROUND OF THE INVENTION

Printed circuit boards (PCBs), laminate chip carriers, and the like permit formation of multiple circuits in a minimum volume or space. Such structures typically comprise a stack of layers of signal, ground and/or power planes (lines) separated from each other by a layer of dielectric material. The lines on one plane are often in electrical contact with those on another plane by plated holes passing through the dielectric layers. The plated holes are often referred to as "vias" if internally located, "blind vias" if extending a predetermined depth within the board from an external surface, or "plated-thru-holes" (PTHs) if extending substantially through the board's full thickness. By the term "thru-hole" as used herein is meant to include all three types of such board openings, or "holes."

Known methods for fabricating PCBs, chip carriers and the like typically comprise fabrication of separate inner-layer circuits (circuitized layers), which are formed by coating a photosensitive layer or film over a copper layer of a copper clad inner-layer base material. The photosensitive coating is imaged, developed and the exposed copper is etched to form the desired number of conductor lines. The photosensitive film is then stripped from the copper, leaving the circuit pattern on the surface of the inner-layer base material. Often, this methodology is referred to as photolithographic processing in the PCB art. Added description is not believed necessary in view of such known teachings.

A multilayered stack is formed, following formation of the desired number of inner-layer circuits, by preparing a lay-up of inner-layers, ground planes, power planes, etc., typically separated from each other by a layer of dielectric "pre-preg" material, which usually includes a layer of glass cloth (e.g., fiberglass) impregnated with a partially cured material (e.g., a "B-stage" epoxy resin). The outermost (top and bottom) layers of the stack usually comprise copper clad, glass-filled, epoxy planar substrates with the copper cladding comprising exterior surfaces of the stack. This stack is laminated to form a monolithic structure using heat and pressure to fully cure the B-stage resin. As understood, the resulting stack typically has metal (usually copper) cladding on both of its exterior surfaces. Exterior circuit layers are formed in the copper cladding using procedures similar to the procedures used to form the inner-layer circuits. In a well known such procedure, a photosensitive film is applied to the copper cladding, exposed to patterned activating radiation, and developed. An etchant is then used to remove copper bared by the development of the photosensitive film. Finally, the remaining photosensitive film is removed to provide the exterior circuit layers. Various elements of these outer layers, such as pads, may then be electrically coupled to selected electronic components mounted on the structure, such components including capacitors, resistors, modules, and the like, including even semiconductor chips.

Conductive thru-holes (or "interconnects", as often referred to in the art) are used to electrically connect individual circuit layers within the structure to each other and/or to the outer surfaces, these thru-holes passing through all or a portion of the "stack". Thru-holes are generally formed prior to the formation of circuits on the exterior surfaces by drilling holes through the stack at appropriate locations. Following several pre-treatment steps, the walls of the holes are typically catalyzed by contact with a plating catalyst and metallized, typically by contact with an electro-less or electrolytic copper plating solution to form conductive pathways between circuit layers. Following formation of the conductive thru-holes, exterior circuits, or outer conductive layers are formed using the above procedure(s).

Following the described construction, the aforementioned semiconductor chips and/or other electrical components are mounted at appropriate locations on the exterior circuit layers of the multilayered structure, typically using solder mount pads to bond the components. These components are usually in electrical contact with the circuits within the structure through the conductive thru-holes, as desired. Such solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and then exposed and developed to yield an array of openings defining the pads. The openings are then coated with solder using processes known to the art, one known process being wave soldering.

Significantly, the relative complexity of the designs of resulting products as described herein has increased substantially over the past few years. Mainframe computer PCBs, for example, may require as many as thirty-six layers of circuitry or more, with the complete structure having a thickness of as much as about 0.250 inch (250 mils). These boards are typically designed with about three or five mil wide signal lines and twelve mil diameter thru-holes. For increased circuit densification in many of today's products such as PCBs, chip carriers and the like, the industry desires to reduce signal lines to a width of two mils or less and thru-hole diameters to two mils or less. Most known commercial procedures, especially those of the nature described herein, are incapable of economically forming the dimensions desired by the industry in a cost effective manner.

The PCB industry, in addition to requiring decreasing line widths and via diameters, also desires to avoid manufacturing problems frequently associated with their PCB products, chip carriers and the like. As stated, current processes utilize innerlayer materials that are glass-reinforced resin or other suitable dielectric material layers having a thickness of from about two to five mils, clad with metal (typically copper) on both surfaces. Glass-reinforcing material, typically utilizing continuous strands of fiberglass which extend throughout the width and length of the overall final substrates, is used to contribute strength and rigidity to the final stack. Being continuous, these strands commonly run the full width (or length) of the structure and include no breaks or other segments as part thereof. Thus, by the term "continuous" as used herein to define fibrous materials is meant a structure such as a woven cloth of lengthy fibers, including fibers which, as stated, typically run the full distance through the structure. By the term "semi-continuous" as used herein (below) to define fibrous materials is meant structures with much shortened length fibers, which are also referred to as "chopped" fibers, such as chopped fiber mats. Such fibrous materials occupy a relatively significant portion of the substrate's total volume, a disadvantage especially when attempting to produce highly dense numbers of thru-holes and very fine line circuitry to meet new, more stringent design requirements. More specifically, when holes are drilled (typically using laser or mechanical drills) to form these needed thru-holes, end segments of the fiberglass fibers may extend into the holes during lamination, and, if so, must be removed prior to metallization. This removal, in turn, creates the need for additional pretreatment steps such as the use of glass etchants to remove the glass fibrils extending into the holes, subsequent rinsing, etc. If the glass is not removed, a loss of continuity might occur in the hole's internal wall metal deposit. In addition, both continuous and semi-continuous glass fibers add weight and thickness to the overall final structure, yet another disadvantage associated with such fibers. Additionally, since lamination is typically at a temperature above 150° C., the resinous portion of the laminate usually shrinks during cooling to the extent permitted by the rigid copper cladding, which is not the case for the continuous strands of fiberglass or other continuous reinforcing material used. The strands thus take on a larger portion of the substrate's volume following such shrinkage and add further to complexity of manufacture in a high density product. If the copper is etched to form a discontinuous pattern, laminate shrinkage may not be restrained even to the extent above by the copper cladding. Obviously, this problem is exacerbated as feature sizes (line widths and thicknesses, and thru-hole diameters) decrease. Consequently, even further shrinkage may occur. The shrinkage, possibly in part due to the presence of the relatively large volume percentage of continuous or semi-continuous fiber strands in the individual layers used to form a final product possessing many such layers, may have an adverse affect on dimensional stability and registration between said layers, adding even more problems for the PCB manufacturer.

The presence of glass fibers, especially woven glass fibers, also substantially impairs the ability to form high quality, very small thru-holes using a laser. Glass cloth has drastically different absorption and heat of ablation properties than typical thermo-set or thermo-plastic matrix resins. In a typical woven glass cloth, for example, the density of glass a laser might encounter can vary from approximately 0% in a window area to approximately 50% by volume or even more, especially in an area over a cloth "knuckle". This wide variation in encountered glass density leads to problems obtaining the proper laser power for each thru-hole and may result in wide variations in thru-hole quality, obviously unacceptable by today's very demanding manufacturing standards.

The presence of glass fibers in a multilayered structure of the types mentioned herein also often contributes to an electrical failure mode known as CAF growth. CAF (cathodic/anodic filament) growth often results in an electrical shorting failure which occurs when dendritic metal filaments grow along an interface (typically a glass fiber/epoxy resin interface), creating an electrical path between two features which should remain electrically isolated. Whether continuous (like woven cloth) or semi-continuous (like chopped fiber mattes), glass fiber lengths are substantial in comparison to the common distances between isolated internal features, and thus glass fibers can be a significant detractor for PCB insulation resistance reliability. While the use of glass mattes composed of random discontinuous chopped fibers (in comparison to the longer fibers found in continuous structures) can largely abate the problem of inadequate laser drilled thru-hole quality, such mattes still contain fibers with substantial length compared to internal board feature spacing and, in some cases, offer virtually no relief from the problem of this highly undesirable type of growth.

In U.S. Pat. No. 5,246,817, there is described one form of improvement in the manufacture of products such as PCBs. The manufacturing process in U.S. Pat. No. 5,246,817 consists of the sequential formation of layers using photosensitive dielectric coatings and selective metal deposition procedures. The first layer of the board is formed over a temporary or permanent carrier, which, if the latter, will become an integral part of the board. When the carrier is a circuit, the process comprises formation of a dielectric coating over the circuit with imaged openings defining the thru-holes. The imaged openings may be formed by exposure of a photosensitive dielectric coating to activating radiation through a mask in an imaged pattern, followed by a described development procedure. Alternatively, imaging may be by laser ablation, in which case, the dielectric material need not be photosensitive. Metal is deposited into the recesses within the dielectric coating to form the conductive thru-holes. Thereafter, an additional layer of dielectric material is coated onto the first dielectric layer, imaged in a pattern of circuit lines, and the recesses are then plated with metal. After imaging the first dielectric coating, it may alternatively be coated with a second dielectric coating and imaged and the recesses plated with metal to form the thru-holes and circuit lines simultaneously. By either process, the walls of the imaged opening or recesses in the dielectric coating contain metal as it deposits during plating and assures a desired cross-sectional shape of the deposit. Plating desirably fills the entire recess within the imaged photosensitive coating. The process, obviously very complex and costly, is repeated sequentially to form sequential layers of circuits and thru-holes.

In U.S. Pat. No. 6,207,595, there is described another example of a dielectric material composition for use in a PCB in which the dielectric layer's fabric material is made from a cloth member having a low enough content of particulates and a sufficient quantity of resin material to completely encase the cloth member including the particulates, so that the resin material extends beyond the highest protrusions of the cloth member (i.e. the fabric material is thicker and will pass a certain test standard (in '595, the known HAST level A test). Thus, the woven cloth is known to include a quantity of particulates, which term is meant in '595 to include dried film, excess coupler, broken filaments, and gross surface debris. A process is described where a sizing of polyvinyl alcohol, corn starch and a lubricant of oil is applied to the strands of fiber prior to weaving in order to improve the weaving process and minimize breakage of the strands. After weaving, the sizing is removed by a firing step to clean the filaments of lubricants and other materials. However, some sizing is randomly left behind as particulates. Encasing the woven cloth including the particulates is a quantity of hardened resin material. The resin may be an epoxy resin such as one often used for "FR4" composites ("FR4" has become a conventional, abbreviated name for the resulting substrates and often also for the resins forming part thereof, and is based in part on the flame retardant (hence the "FR" designation) rating of these established products). A resin material based on bismaleimide-triazine (BT) is also acceptable for the structure in this patent. More preferably, the resin is a phenolically hardenable resin material known in the PCB industry. This patent thus requires continuous fibers (those extending across the entire width (or length) of the dielectric layer except for possible inadvertent interruptions caused by drilling of the thru-holes needed in the final product, causing these fibers to become what might be called as "broken." The aforementioned problem with fiber strands exposed to the holes is thus possible in this patent's process and resulting structure.

In U.S. Pat. No. 5,418,689, there is described a PCB product wherein the dielectric substrate can include a thermoplastic and/or thermosetting resin. Thermosetting polymeric materials mentioned in this patent include epoxy, phenolic base materials, polyimides and polyamides. Examples of some phenolic type materials include copolymers of phenol, resorcinol, and cresol. Examples of some suitable thermoplastic polymeric materials include polyolefins such as polypropylene, polysulfones, polycarbonates, nitrile rubbers, ABS polymers, and fluorocarbon polymers such as polytetrafluoroethylene, polymers of chlorotrifluoroethylene, fluorinated ethylenepropylene polymers, polyvinylidene fluoride and polyhexafluoropropylene. The dielectric materials may be molded articles of the polymers containing fillers and/or reinforcing agents such as glass filled polymers. "FR4" epoxy compositions that are employed in this patent contain 70-90 parts of brominated polyglycidyl ether of bisphenol-A and 10-30 parts of tetrakis (hydroxyphenyl) ethane tetraglycidyl ether cured with 3-4 parts of dicyandiamide, and 0.2-0.4 parts of a tertiary amine, all parts being parts by weight per hundred parts of resin solids. Another "FR4" epoxy composition may contain about 25 to about 30 parts by weight of a tetrabrominated digylcidyl ether of bisphenol-A having an epoxy equivalent weight of about 350 to about 450; about 10 to about 15% by weight of a tetrabrominated glycidyl ether of bisphenol-A having an epoxy equivalent weight of approximately 600 to about 750 and about 55 to about 65 parts per weight of at least one epoxidized, nonlinear novolak having at least 6 terminal epoxy groups; along with suitable curing and/or hardening agents. A still further "FR4" epoxy composition contains 70 to 90 parts of brominated polyglycidyl ether of bisphenol-A and 10 to 30 parts of tetrakis (hydroxyphenyl) ethane tetraglycidyl ether cured with 0.8-1 phr of 2-methylimidazole. Still other "FR4" epoxy compositions employ tetrabromobisphenol-A as the curing agent along with 2-methylimidazole as the catalyst.

In U.S. Pat. No. 6,323,436, PCBs are prepared by first impregnating a non-woven aramid chopped fiber mat or a thermoplastic liquid crystalline polymer (LCP) paper instead of the reinforcement typically used in the electronics industry, described in this patent as a woven glass fabric. This aramid reinforcement matte is comprised of a random (in-plane) oriented mat of p-aramid (poly (p-phenylene terephthalamide)) fibers comprised of Kevlar (Kevlar is a registered trademark of E. I. duPont deNemours and Company), and has a dielectric constant of 4.0 as compared to 6.1 for standard E-glass cloth. The lower permittivity of the non-woven aramid reinforcement provides for faster signal propagation, allowing increased wiring density and less crosstalk, which becomes increasingly important for high I/O chips and miniaturization. Since the p-aramid fibers are transversely isotropic and have an axial CTE of about −3 to about −6 ppm/degree Celsius (hereinafter C.) when combined with a thermosetting resin, the final composite described in this patent is said to possess a CTE which can be controlled and adjusted to match that of silicon or semiconductor chips in the range of about 3 to about 10 ppm/degree C. The thermoplastic liquid crystal polymer (LCP) paper is a material called Vecrus (Vecrus is a registered trademark of Hoechst Celanese Corp.), which uses the company's Vectra polymer as part thereof (Vectra also being a registered trademark of Hoechst Celanese Corp.). According to this patent, the paper has a dielectric constant of 3.25, a dissipation factor of 0.024 at 60 Hertz (Hz), a UL 94-VO rating and an in-plane CTE of less than 10 ppm/degree. C. The alleged advantages of this material over the aramid mat are the lower dielectric constant and very low moisture absorption, allegedly less than 0.02%. The non-woven aramid or LCP paper is used in conjunction with a thermosetting resin to form the final composite substrate. Examples of thermosetting resins useful in this patent include epoxy, cyanate ester, bismaleimide, bismaleimide-triazine, maleimide or combinations thereof. The resin-impregnated low CTE reinforcement is then partially cured to a "B"-stage to form the pre-preg, and then the pre-preg is cut, stacked, and laminated to form a sub-composite with exterior copper sheets.

In U.S. Pat. No. 5,314,742, there is described the use of non-woven aramid sheets to provide reinforcement for the resulting laminate. The reinforcing aramid sheet is described as having a coefficient of thermal expansion (CTE) of less than 10 ppm per .degree. C and is prepared from 75 to 95 wt. % p-aramid floc and from 5 to 25 wt. % poly(m-phenylene isophthalamide) fibrids. Floc is defined in U.S. Pat. No. 4,729,921. Para-aramid fibers are very high in strength and modulus. Examples of para-aramid fibers are set out in U.S. Pat. No. 3,869,429. Specific examples of para-aramid materials are poly(p-phenylene terephthalamide) (PPD-T) and copoly(p-phenylene-3,4'-oxydiphenylene terephthalamide). Fibers of PPD-T are generally made by an air gap spinning process such as described in U.S. Pat. No. 3,767,756, and are preferably heat treated as described in U.S. Pat. No. 3,869, 430. Preferably, poly (p-phenylene terephthalamide) floc which has not been refined is utilized. High shear forces exerted on the fibers during processing, e.g., refining, may cause damage to the fibers and adversely affect the CTE of the reinforcement. It is also preferred to employ p-aramid floc of high orientation and relatively lower crystallinity. Fibrids are described in U.S. Pat. No. 4,729,921. To prepare the sheet, the floc and fibrids are dispersed in the desired proportions as an aqueous slurry, the solids concentration generally ranging between 0.005% and 0.02%. The slurry is not refined. The slurry can be made into paper by conventional means. In the examples mentioned in this patent, wet sheets were formed in an inclined wire Deltaformer papermaking machine and dried using heated drier cans. The dried sheets preferably had a basis weight between 0.8 and 4.0 oz/yd$^2$, and were then calendered between two hard-surface rolls. Calender pressures between about 500 and 2500 kg/cm (nip pressure) and roll temperatures between about 130 and 150 degrees C. were used. The paper was then pre-pregged with a resin having a high glass transition temperature (Tg), e.g., above about 160 degrees C.

"Expanded PTFE" dielectric materials represent another type of materials known for use in circuitized substrates, PTFE being the designate for polytetrafluoroethylene. A common example of such material is the aforementioned Teflon, sold by E. I. DuPont de Nemours and Company. In U.S. Pat. No. 5,652,055, for example, there is described an adhesive sheet (or "bond ply") material suitable to serve as adhesive layers in a variety of adhesive applications, such as in circuit board laminates, multi-chip modules, and in other electrical applications. The adhesive sheet is described as being constructed from an expanded PTFE material, such as that described in U.S. Pat. No. 3,953,566. Preferably, the material is filled with inorganic filler and is constructed as follows: A ceramic filler is incorporated into an aqueous dispersion of dispersion-produced PTFE. The filler in small particle form is ordinarily less than 40 microns in size, and preferably less than 15 microns. The filler is introduced prior to co-coagulation in an amount that will provide 10 to 60%, and preferably 40 to 50% by weight filler in the PTFE, in relation to the final resin-impregnated composite. The filled PTFE dispersion is then co-coagulated, usually by rapid stirring. The coagulated filled PTFE is then added. The filled material is then lubricated with a common pastep extrusion lubricant, such as mineral spirits or glycols, and then pastep extruded. The extrudate is usually calendered, and then rapidly stretched 1.2 to 5000 times, preferably 2 times to 100 times, per this patent, at a stretch rate of over 10% per second, at a temperature of between 35 degrees C. and 327 degrees C. The lubricant can be removed from the extrudate prior to stretching, if desired. The resulting expanded, porous filled PTFE is then imbibed with adhesive by dipping, calendaring, or doctor blading on a varnish solution of about 2% to 70% adhesive in solvent. The wet composite is then affixed to a tenter frame, and subsequently "B-staged" at or about 165 degrees C. for 1 to 3 minutes. The resulting sheet adhesive typically consists of: (a) 9 to 65 weight percent PTFE; (b) 9 to 60 weight percent inorganic filler, in the form of particulate; and (c) 5 to 60 weight percent adhesive imbibed within the porous web structure.

Other types of expanded-PTFE substrate materials are described in the aforementioned U.S. Pat. No. 3,953,566, and also in U.S. Pat. Nos. 4,187,390 and 4,482,516, as well as many others. U.S. Pat. No. 4,187,390 is particularly interesting because it delves substantially into both nodes and fibrils used as part of such substrate materials, breaking these down into such dimensional constraints as node height, node width, node length, and fibril length.

Other examples of methods of making circuitized substrates such as PCBs are described and illustrated in the several documents cited in the aforementioned co-pending application Ser. No. 10/812,890, the teachings of which, in addition to those other patents and applications listed above, are incorporated herein by reference.

The several examples of dielectric materials mentioned in many of the above documents are considered to have a limited usefulness as a substrate dielectric because of what can be referred to as high moisture absorptivity. That is, these dielectric materials tend to absorb what might be referred to as undesirable levels of moisture (a primary example being water) during processing and subsequent storage thereof. This unacceptable moisture results in the dielectric structure having unpredictable dimensional stability during processing and delamination, or blistering in the final component or board assembly process. By the term "high moisture absorptivity" as used herein is meant a level of moisture (water and other fluid materials, including other processing liquids and even gases to which the dielectric material is exposed during processing, storage and shipping) absorption greater than about 0.27 percent, as measured at a temperature of about 22° C. for a time period of about 24 hours. A specific example used in the industry is when the dielectric layer is immersed in water at this temperature for this time period. An absorption level greater than about 0.27 percent is deemed unacceptable for the reasons given above.

The present invention as defined herein represents a significant improvement over products and processes such as those described above. One particularly significant feature of this invention is the provision of a composite layer including a first dielectric sub-layer including a plurality of fibers having a low coefficient of thermal expansion and a second dielectric sub-layer of a low moisture absorptivity resin not including continuous or semi-continuous fibers or the like as part thereof. The invention is thus uniquely able to combine the significant advantages of fiber use, especially those relating to reinforcement, with a non-fibrous second sub-layer including a low moisture absorptivity resin, to produce a multilayered structure in which high density arrays of thru-holes are possible without, substantially, the aforementioned disadvantages associated with such fiber usage. Low moisture absorptive polymer resin is defined herein as a resin that absorbs less than about 0.27 percent by weight moisture at room temperature (22° C.) for a period of 24 hours, while immersed in water.

It is believed that such an invention will represent a significant advancement in the art.

OBJECTS AND SUMMARY OF THE INVENTION

It is a primary object of the invention to enhance the art of circuitized substrates.

It is another object of the invention to provide a new dielectric material for use in a circuitized substrate which includes enhanced moisture adsorption properties to result in a dielectric layer which can be processed efficiently, utilizing the methods as taught and described herein.

It is another object to provide a new and unique method of making a circuitized substrate which is adaptable to current manufacturing procedures, utilizes the new dielectric material defined herein, and which is accomplished by more simplified usage thereof to thereby result in a product of reduced cost.

It is still another object of the invention to provide products adapted for utilizing circuitized substrates possessing the advantageous features defined herein.

According to one embodiment of the invention, there is provided a method of making a circuitized substrate, the method comprising providing a composite layer including a first sub-layer including a plurality of semi-continuous fibers having a low coefficient of thermal expansion and a second sub-layer of a low moisture absorptivity resin, this second sub-layer not including continuous or semi-continuous fibers or the like as part thereof. The method further includes the step of positioning at least one circuitized layer on the first sub-layer of the composite layer.

BEST MODE FOR CARRYING OUT THE INVENTION

For a better understanding of the present invention, together with other and further objects, advantages and capabilities thereof, reference is made to the following disclosure and appended claims in connection with the above-described drawings. Like figure numbers will be used from FIG. to FIG. to identify like elements in these drawings.

"Information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

Other definitions for many of the terms used herein, e.g., "thru-hole", "high moisture absorptivity", "continuous" (for fibers), etc. are provided above.

Figure 1:
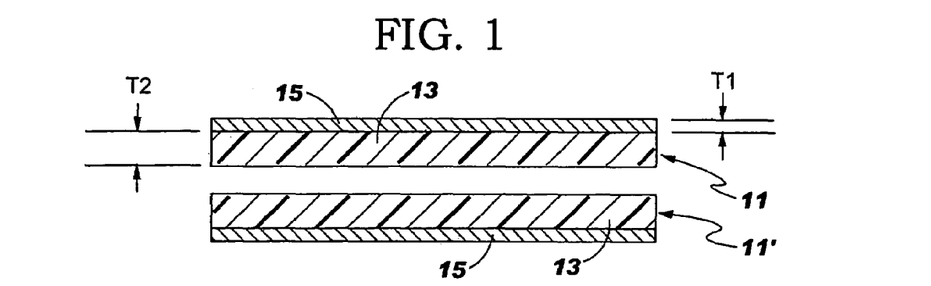
FIGS. 1-6 represent steps utilized to produce a circuitized substrate in accordance with one embodiment of the invention, FIGS. 3-6 being on a slightly larger scale than those of FIGS. 1 and 2.

FIG. 1 illustrates an initial step in forming a circuitized substrate as defined herein. As understood from the following, a key attribute of the present invention is the utilization of a dielectric composite material as part of the substrate which enables the provision of high density arrays of thru-holes within the substrate while substantially preventing electrical shorting or the like between closely spaced, adjacent holes. That is, very highly dense concentrations of relatively narrow (in diameter) thru-holes are capable of being provided in this unique dielectric layer which can then be rendered conductive (typically, plated) to provide highly dense circuit connections between designated conductive layers (e.g., signal, power and/or ground) within the final structure incorporating the circuitized substrate. Most significantly, this new dielectric material includes a sub-layer of a very low moisture absorptivity resin, and, equally significant, further comprises a sub-layer which includes fibers having a low coefficient of thermal expansion. The low moisture absorptivity sub-layer does not include continuous or semi-continuous fibers therein. As explained, use of such fibers is often deleterious when producing substrates during the hole-forming and plating stages because of fiber or its material intrusion within the holes which can form a base for a conductive path to adjacent conductive holes. The composite layer of dielectric material as taught herein is substantially able to overcome such disadvantages while simultaneously taking advantage of the reinforcing properties of such fibers by virtue of placement thereof in a sub-layer format combined with another sub-layer not having same. The unique material taught herein is also able to overcome such associated fiber disadvantages while assuring a product with relatively high dielectric reliability in a relatively thin final composite layer, both features being highly desirable if the final product (e.g., chip carrier or PCB) using the substrate is to meet many of today's high density and miniaturization requirements. As mentioned above, the new dielectric material of the invention possesses low moisture absorption properties which are extremely beneficial because it provides for ease of processing (including during lamination when temperatures may exceed 245 deg. C.) and a highly desirable low dielectric. Layers including this material possess sufficient strength and durability to withstand the rigors, particularly the high temperatures and pressures, associated with lamination as conventionally utilized in the manufacture of PCBs. Also, the resulting product is produced using standard PCB manufacturing processes without any significant modification thereto, thereby keeping product costs down.

As stated, the dielectric material used to form the circuitized substrate of the various embodiments of the invention defined herein is in the form of a composite layer of dielectric material which includes two sub-layers of dielectric as part thereof. One sub-layer is comprised of a low moisture absorptivity resin, preferably a high Tg (glass transition temperature) thermosetting polymer. This resin has less than 0.27% moisture absorption when the sub-layer is immersed in water for a period of about 24 hours at a temperature of about 22° C. Significantly, the resin of this sub-layer comprises from about 10 to about 80 percent by weight of the sub-layer. In sharp comparison, the other sub-layer includes semi-continuous fibers having a low coefficient of thermal expansion. This layer can be of different thicknesses, one preferred range for such thicknesses being from about 20 microns to about 300 microns. The preferred material for these fibers is non-woven aramid. The fibers are of the semi-continuous type and are randomly distributed in the x-y plane and fused or held together with a binder having similar or identical composition as the aramid fibers. Of further significance, the sub-layer containing such fibers is also preferably comprised of a low moisture absorptivity resin, a preferred example being the same resin as used in the other sub-layer. That is, this second resin (for the first sub-layer, also has a high glass transition temperature, Tg. Having the fibers as part thereof, the coefficient of thermal expansion (CTE) of this sub-layer is preferably about 8 to 12 p.p.m. per degree C. in both x and y directions. As in the other sub-layer, the resin in this sub-layer also comprises from about 10 to about 80 percent by weight of the first sub-layer, the fibers comprising substantially the remaining weight percentage.

As will be shown with the description below relating to the drawings, both the first and second sub-layers further include a plurality of thru-holes therein, the aspect ratio of the thickness of said circuitized substrate to the diameter of each of said thru-holes being within the range of from about 2:1 to about 20:1.

In a preferred embodiment, the dielectric resin material is a high glass transition temperature (Tg), dicyandiamide (DICY)-free epoxy polymer resin available from Huntsman Advanced Materials in Brewster, N.Y. under the product name Araldite LZ-8213. This particular resin has an epoxy equivalent weight of about 280-400, a viscosity of approx. 300-900 cps, a solids content percentage of about 70-73, a boiling point of about 80 deg. C. and a molecular weight of about 1200-1400 grams per mole. Araldite LZ-8213 resin is a thermosetting polymer. Optionally, a high molecular weight, reactive thermoplastic resin such as InChem "PKHS-40" resin (available from InChem Corporation in Rock Hill, S.C.) may be used, including in combination with the above-identified resin material. This material will impart toughness and coating flake-off resistance. InChem's "PKHS-40" resin has a specific gravity of 0.965, a solid weight percent of about 39-41, a boiling point of 80 deg. C., and, importantly, a viscosity within the range of about 4500 to 7000 centipoise (cp) at 25 deg. C. If used in combination with another resin, the PHKS-40 resin should comprise from about 3 percent to about 25 percent by weight of the total resin composition and about 1.5 percent to about 12.5 percent of the total layer volume.

It is also within the scope of the invention to add a silica component to the resin material. A preferred example is thixotropic-silica, sold under the product name Aerosil R-972 by Degussa Corporation of Teterboro, N.J. Aerosil R-972 silica is a hydrophobic amorphous fumed silica having a melting point of 1700 deg. C., a specific gravity of 2.2, and a pH of about 3.6-5.0, and can be added to achieve an improved balance between the solution viscosity of the solvent containing coating varnish and the melt viscosity of the B-staged (see more below) dielectric coating.

Optionally, inorganic fillers may be utilized in combination with the aforementioned low moisture absorptivity resin in volume ranges from about 10% by volume to about 80% percent by volume of the total resulting dielectric layer's volume to produce the second sub-layer of the present invention (that having the low moisture absorptivity resin and not fibers). Examples of such inorganic fillers include Tatsumori PLV6 and PLV4 fillers, available from Tatsumori, Tokyo 105 Japan. The particles of these fillers each preferably have a size within the range of about 200 Angstroms to about 35 microns, a preferred size being about 5 microns. The above ranges are not meant to limit the invention, as others are acceptable for use in the present invention. Other thermally conductive and electrically insulating fillers could be used for improving the thermal heat transfer from the device to the surroundings. Such fillers include aluminum oxide, 92% alumina, 96% alumina, aluminum nitride, silicon nitride, silicon carbide, beryllium oxide, boron nitride and diamond powder (made with either high pressure or a plasma CVD process). Especially preferred of these fillers are aluminum oxide and aluminum nitride because of the high thermal conductivity thereof.

The preferred filler can be optionally pre-treated with a coupling agent, such as γamino propyl triethoxy silane (A1100), β-(3,4-epoxy cyclohexyl) ethyltrimethoxy silane (A186), or the aforedescribed γ-glycidylpropyltrimethoxy silane (Z-6040) from Dow-Corning. An amount of this coupling agent which is about 0.25% by weight of filler has been found to be satisfactory. The amount should not be more than about a few monolayers. The particles as used provide low expansion for the final layer in comparison to a resin material not including same. Of further significance, the particles assure a finished second sub-layer composite structure which has a relatively low isotropic expansion in the 25-35 ppm (parts per million)/degrees Celsius (C) thermal expansion range. Further, the particles provide fracture and fatigue resistance, relatively low moisture absorption and a roughened surface texture sufficient to facilitate subsequent plating (especially with copper) on the formed thru-hole and other, e.g., external, surfaces. The addition of specific volume percentages of particles thus allows the product manufacturer to adjust the coefficient of thermal expansion (CTE).

Suitable catalysts for the epoxy include amines such as the imidazoles, tertiary amines such as benzyldimethylamine, 1.3-tetramethyl butane diamine, tris (dimethylaminomethyl) phenol, pyridine, and triethylenediamine, and acidic catalysts, such as stannous octoate. A solvent such as methyl ethyl ketone may be added to dissolve the various resins and permit coating of the selected carrier.

Dielectric composite layers produced using the above sub-layer materials possess the following key electrical, thermal, physical and thermal expansion properties, as defined by process development analyses. Sub-layer 1 is understood to be the sub-layer with fibers having the defined low CTE, while sub-layer 2 is understood to be the sub-layer with the low moisture absorptivity resin and no fibers. These properties are:

|  | Sub-layer 1 | Sub-layer 2 |
|---|---|---|
| Electrical Properties |  |  |
| Dielectric constant (Dk) at 1-2.5 GHz | 3.5 | 3.6 |
| Loss factor at 1 MHz | 0.016 | 0.013 |
| Thermal Properties |  |  |
| Tg (DSC mid point) (deg. C.) | 180 | 181 |
| Tg (TMA)(deg. C.) | 175 | 175 |
| Decomposition Temperature (deg. C.) | 320 | 327 |
| Thermal Expansion |  |  |
| Below Tg (ppm/deg. C.) | 8-12 | 28-35 |
| Above Tg (ppm/deg. C.) | 5-6 | 111 |
| Physical Properties |  |  |
| % moisture, after 24 hours | 0.15 | 0.15 |
| % moisture, after 1 hour (pressure cooker conditions - 121 deg. C./100% relative humidity) | 0.27 | 0.25 |
| Elongation (%) | 3.0 | 2.5 |

The resulting layer composite structure (or free-standing film) of finally hardened resin material and fiber-containing sub-layer has very low moisture absorptivity (less than about 0.15% moisture absorption after being immersed for 24 hours in water at 22° C. (room temperature)) and makes it very unique as a substrate for building PCBs and chip carriers. Equally important, this composite layer and additional similar composite layers, when staged as defined, are then readily receptive to subsequent circuitization processing using conventional photolithographic processing. In a preferred embodiment, the desired circuitry is formed of copper and applied using such processing. Photolithographic processing of substrates of this type is well known in the PCB field and further description is not deemed necessary.

It has been discovered that when drilling (e.g., typically using a laser, described below) thru-holes in the above composite material, highly dense concentrations of such hole patterns are attainable without, surprisingly, electrical shorting of the holes after plating of the sidewalls thereof has occurred. That is, the plating material (typically copper) does not migrate from thru-hole to thru-hole, as occasionally occurred when continuous and/or semi-continuous fiberglass and other fibrous materials were utilized in earlier dielectric compositions. In one embodiment of the invention, it was possible to drill a total of 10,000 holes within one square inch of dielectric layer, representing an extreme example of the high density hole patterns attainable using the unique teachings herein. Pattern densities ranging from about 500 holes per square inch to about 10,000 holes per square inch are attainable using the present invention's teachings. As stated, a laser is preferably used for such drilling, and in particular, a YAG laser, which may operate at speeds of 20-50 thru-holes per second, each hole having a two mil diameter and extending through the dielectric layer. This laser is also capable of providing up to 250 thru-holes per second with the resulting holes having similar diameters but extending only partly into the dielectric layer (also referred to as "blind vias" as mentioned above).

As further understood from the description herein, a particular use for the circuitized substrate formed herein is as part of a chip carrier or a PCB or other electronic packaging product such as those made and sold by the Assignee of the instant invention. One particular example is a chip carrier sold under the name Hyper-BGA chip carrier (Hyper-BGA being a registered trademark of the Assignee, Endicott Interconnect Technologies, Inc.). The invention is of course not limited to chip carriers or even to higher level PCBs. It is also understood that more than one such circuitized substrates (e.g., those each also referred to as a "core", a specific example being what is referred to as a "power core" if the core includes one or more power planes and is thus to serve primarily in this capacity) may be incorporated within such a carrier or PCB, depending on operational requirements desired for the final product. As defined below, the "core" can be readily "stacked up" with other layers, including conductors and dielectric, and bonded together (preferably using conventional PCB lamination processing) to form a much thicker, multilayered carrier or multilayered PCB. The laminate so formed is then subjected to further processing, including conventional photolithographic processing to form circuit patterns on the outer conductive layers thereof. As described herein below, such external patterns can include conductive pads on which conductors such as solder balls can be positioned to connect the structure to other components such as semiconductor chips, PCBs and chip carriers if so desired. The unique teachings of this invention are thus adaptable to a multitude of electronic packaging products. Significantly, the invention enables incorporation of the circuitized substrate (e.g., if a dense "core") with its highly dense thru-hole patterns and interconnection capabilities within a larger multilayered structure in which the other layered portions do not possess such densification and operational capabilities. Thus, a "standard" multilayered product can be produced for most of its structure and the unique subcomponent taught herein simply added in as part of the conventional processing of such a "standard". If the circuitized substrate core is internally positioned, it enables highly dense connections between other, less dense portions of the multilayered product, thus giving said product the unique capabilities of the invention in at least a portion thereof.

Figure 2:
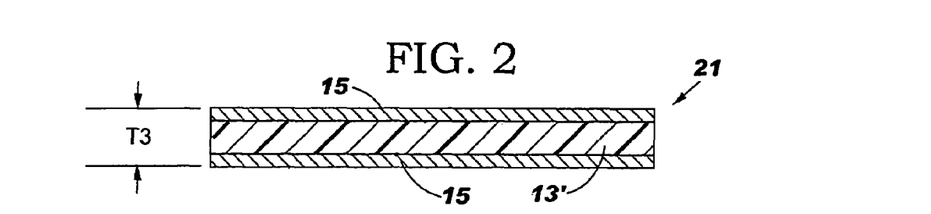

In FIG. 1, one example of an initial step in forming a circuitized substrate as taught herein is shown. In this step, two layered members 11 and 11' are brought together, each layered member including a relatively thin, dielectric sub-layer 13 having a plurality of semi-continuous fibers taught above as part thereof and a conductive layer 15 (preferably copper) positioned thereon. In this embodiment, each conductive layer 15 is bonded to the respective dielectric layer. The FIG. 1 embodiment utilizes two separate dielectric sub-layers 13 of similar dielectric material to form a composite dielectric layer 13' (FIG. 2). However, this is not a requirement of the invention because a single sub-layer 13 of the fiber-containing dielectric may be used, with conductive layers 15 bonded on opposite sides thereof. If of the two member 11 and 1 1' embodiment as shown, dielectric sub-layers 13 are each preferably of a thickness (T2) of only about 1 to 3 mils (thousandths of an inch) with a preferred thickness being 2 mils (0.002 inch). The corresponding thickness (T1) of each conductive layer is preferably within the range of only about 0.3 mils to about 0.7 mils. A preferred conductive layer thickness is 0.5 mils. Each of the dielectric sub-layers, including the defined resin as part of the composition, is preferably in what is known in the art as a "B-stage" state. Layered members 13 and 15' are aligned and bonded together using conventional PCB lamination processing. In one example, a total pressure of about 400 pounds per square inch (p.s.i.) was used, at a temperature of about 188 deg. C., for a period of about 90 minutes. The result is a laminated structure 21 (FIG. 2) having outer conductive layers 15 each of substantially the same thickness as above but a common interim dielectric sub-layer 13' having a compressed thickness of about 4 mils, giving the overall final structure a thickness (T3) of about 5 mils. The interim, now combined dielectric material (referred to in FIG. 2 by numeral 13'), as a result of such lamination, is now in what is referred to in the art as a "C-stage" state, as also mentioned above. The FIG. 2 structure, with the combined sub-layer 13' and the two outer conductive layers 15, is to serve as the first part of the larger structure for the circuitized substrate defined herein, which, as also defined, may serve as a "core" substrate for a thicker, multilayered product such as a PCB or chip carrier.

Figure 3:
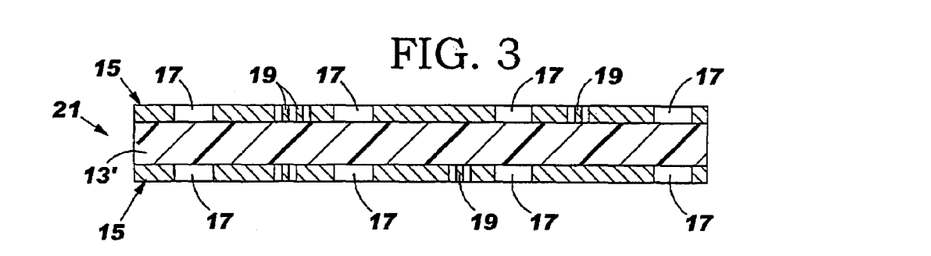

In FIG. 3, structure 21 (now shown on a larger scale than in FIGS. 1 and 2 for illustration purposes) is now subjected to conventional photolithographic processing in which outer conductive layers 15 are "circuitized." That is, layers 15 are processed using known processing to form a desired pattern thereon. This pattern will include, at a minimum, several openings 17 in each layer which are aligned opposite each other as shown. In addition, it is also within the scope of the invention to provide additional circuit features such a lines and/or pads 19 within one or both layers. If structure 21 is to eventually serve as part of a "power core", layers 15 will typically only include openings 19 therein. However, if one or both layers 15 are to function in another capacity, e.g., as a signal layer, then other patterns may be provided. The patterns in FIG. 3 (and FIGS. 4-6) are thus not meant to limit the scope of the invention.

Figure 4:
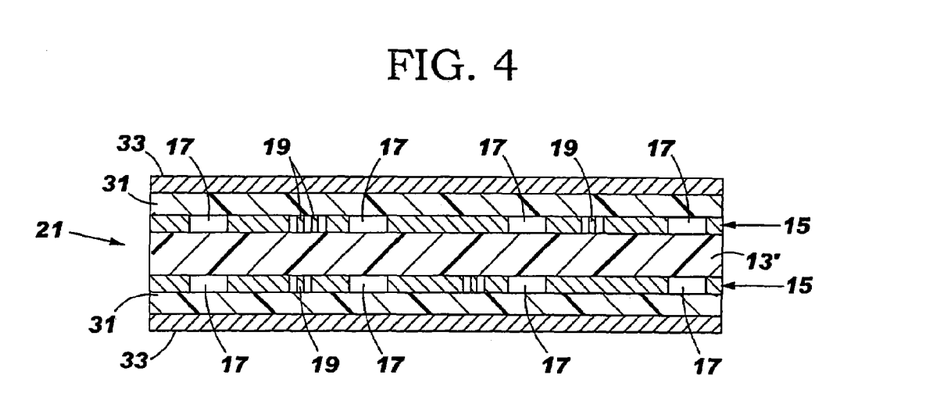
Figure 5:
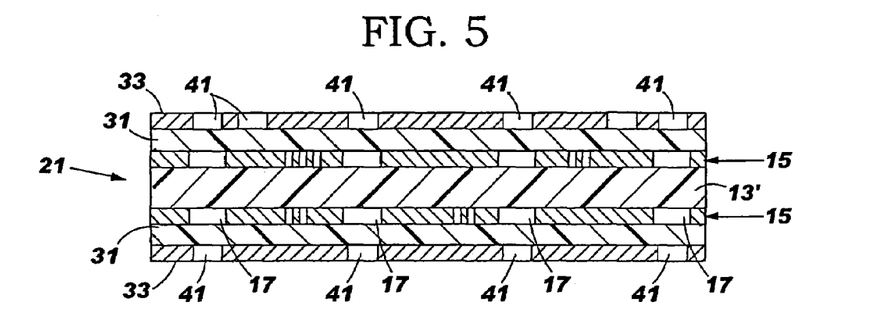
Figure 6:
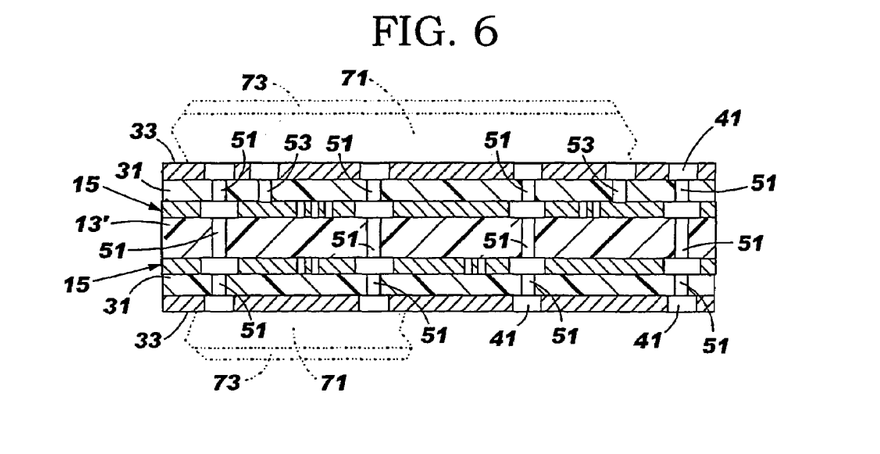

In FIG. 4, structure 21 is shown to include an additional sub-layer 31 of dielectric material on opposite sides of the structure, each of these added sub-layers 31 being a low moisture absorptivity resin having no semi-continuous fibers. These sub-layers 31 serve as low moisture absorption and low thermal expansion sub-layers on opposite sides of structure 21. As shown, each sub-layer 31 preferably includes a thin conductive (e.g., copper) layer 33 thereon. In one example of the invention, layers 31 and 33 are each comprised of the same thicknesses as layers 13 and 15 in FIG. 1 and are laminated onto structure 21 using lamination processes known in the art. Following lamination, each of the conductive layers 33 is "personalized" to include a plurality of openings 41 therein which align with respective ones of the openings 17 in the conductive layers 15 located adjacent thereto (but separated by the interim layer 31), as seen in FIG. 5. It is noteworthy that at least one opening 41 is aligned with a corresponding opening 17, but that other, perhaps smaller openings 41 may also be provided which are not so aligned, but instead align with other portions of the circuit formed on layer 15 (if one has been so formed). With openings 41 formed, thru-holes are drilled within the FIG. 5 structure using a YAG laser as defined above. The laser drills thru-holes through the entire thickness of the FIG. 5 structure wherever paired, aligned openings 17 and corresponding aligned openings 41 are present, as seen in FIG. 6. In one embodiment, a total of 10,000 holes, each having a diameter of only about 2 mils, may be provided in each square inch of the structure in these aligned orientations. This represents, again, the highly dense patterns attainable using the teachings of this invention.

In addition to the highly dense pattern of thru-holes 51 which extend through the entire thickness of the FIG. 5 structure, as seen in FIG. 6, lesser depth thru-holes 53 (also referred to by some in the art as "blind vias") may also be formed simultaneously with the formation of holes 51 to reach only the conductive layer 15. The purpose of these latter holes is to eventually form an electrical connection between conductive layer 33 and layer 15 (e.g., from selected signal lines on one to lines on another, again assuming layer 15 is to function as a signal carrying conductive plane), adding greater versatility to the invention if so used. One or both layers 15 could also serve as a ground layer and thus provide grounding, if so desired. It is understood that thru-holes 51 and 53 (if used) are then to be plated with conductive material, a preferred material being copper having a thickness of only about 0.2-0.75 mils. The preferred plating processes for these and the other thru-holes described herein may be either electrolytic or electro-less, depending on the plating equipment available for such plating. Electrolytic and electro-less plating of thru-holes is well known in the art so further description is not deemed necessary.

The structure shown in FIG. 5 can now be referred to as a circuitized substrate and may serve as a stand alone substrate, e.g., a chip carrier, or, as mentioned, as a "core" structure to be used in combination with other conductive and dielectric layers, including with other similar circuitized substrates, in a larger, multilayered structure.

In FIG. 6, there is shown the addition of such another dielectric layer 71 (in phantom) on opposite sides of the structure formed with thru-holes therein, and an additional conductive layer 73 (also in phantom) on each of the dielectric layers. This drawing FIG. is intended to represent the fact that several additional dielectric and conductive layers may be added to the FIG. 6 structure to form a thicker multilayered final product such as a PCB or laminate chip carrier having more than the number of layers shown in FIGS. 3-6. As stated, it is also possible to incorporate more than one such internal circuitized substrate "core" such as shown in FIG. 6 within such a larger, thicker structure to thus afford the final structure with the teachings of the invention at more than one location therein. To this end, the embodiment of FIG. 5, as also stated, can also be considered such a "core." Finally, it is also within the scope of the invention to utilize all of the FIG. 4 structures only to form a multilayered composite, utilizing known "sticker sheet" dielectric layers between each aligned pair during lamination thereof into the final structure. Whichever the choice, the thru-holes in each of the dielectric-conductive sub-composites (such as that shown in FIG. 4) will be interconnected electrically, thereby providing conductive paths through selected portions of the final structure, including through the entire structure itself, if desired. If, for example, three sub-composites of the type shown herein are combined to form a multilayered final structure (e.g., a multilayered PCB), then it is clear that the thru-holes of the interim sub-composite will provide electrical interconnection, once rendered conductive such as by the afore-defined plating operation, between the thru-holes of the two outer sub-composites bonded on opposite sides of this interim sub-composite.

Figure 7:
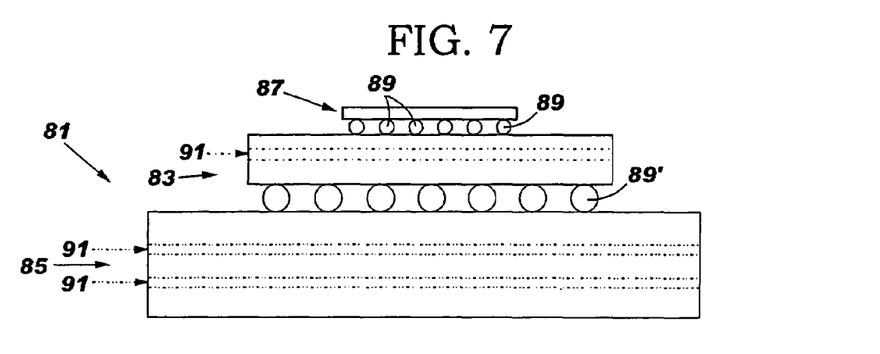
FIG. 7, on a much smaller scale than FIGS. 1 and 2, illustrates an electrical assembly which may utilize one or more of the circuitized substrates defined herein and made in accordance with the teachings herein.
Figure 8:
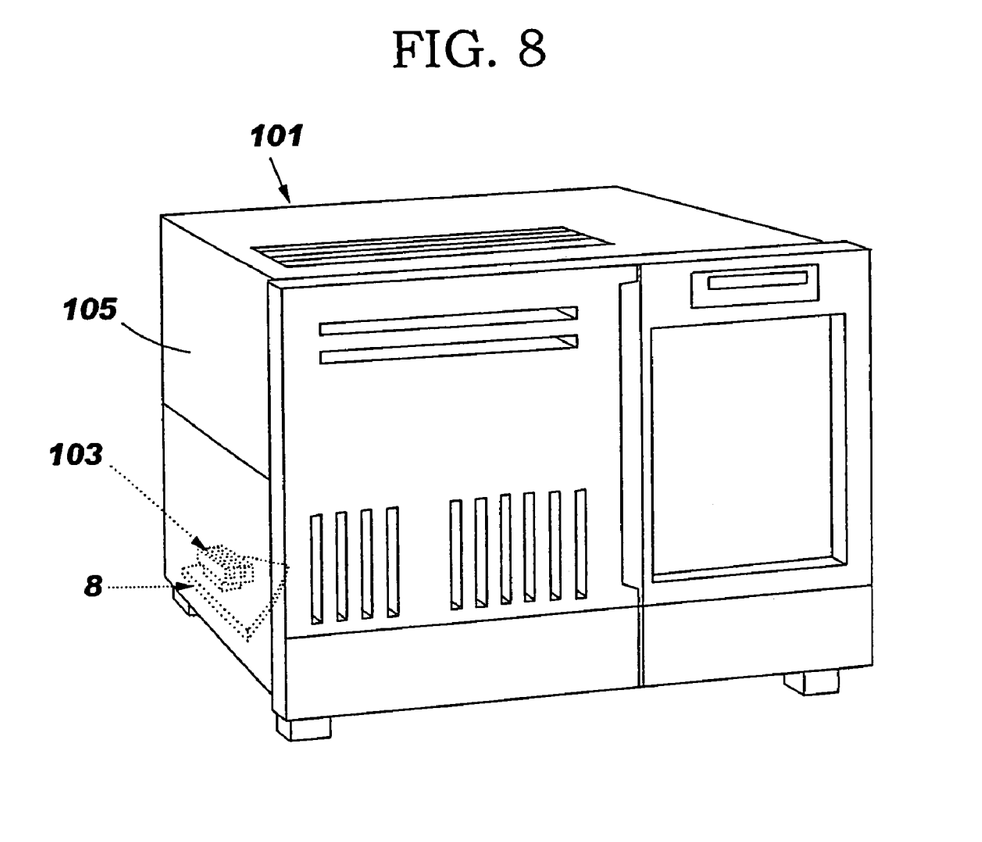
FIG. 8 represents an information handling system according to one aspect of the invention which is capable of utilizing one or more of the circuitized substrates taught herein.

FIG. 7 represents one example of an electrical assembly 81 that may be formed using the circuitized substrates taught herein. As stated, each substrate so formed in accordance with the teachings herein may be utilized within a larger substrate of known type such as a PCB, chip carrier or the like. FIG. 7 illustrates two of these larger components, one being a chip carrier 83 and the other a PCB 85. PCB 85 is positioned within and electrically coupled to an electronic assembly such as an information handling system as shown in FIG. 8, which may be in the form of a personal computer, mainframe, computer server, etc. Chip carrier 83, as shown, is typically positioned on and electrically coupled to an underlying substrate such as PCB 85. Such a carrier also typically has a semiconductor chip 87 mounted thereon and also electrically coupled to the carrier. In the embodiment of FIG. 7, the connections between chip and carrier and between carrier and PCB are accomplished using solder balls 89 and 89', respectively. Such connections are known in the art and further description is not considered necessary. The significance of FIG. 7 is to show the use of one or more of the circuitized substrates 91 (in phantom) of the invention in the chip carrier 83 and PCB 85, thus forming part thereof. Two substrates 91 are shown as used within PCB 85, while only one is shown within carrier 83. As mentioned above, the invention is not limited to the numbers shown. For example, three or more substrates 91, each forming a particular circuitized "core" (e.g., a "power core") within the PCB, may be utilized to afford the PCB the highly advantageous teachings of the invention. Or, as stated, the entire PCB or chip carrier laminate may be comprised of dielectric layers as taught here.

In FIG. 8, there is shown an information handling system 101 in accordance with one embodiment of the invention. System 101 may comprise a personal computer, mainframe computer, computer server, or the like, several types of which are well known in the art. System 101, as taught herein, may include the electrical assemblies as shown in FIG. 7, including both PCB 85 and carrier 83, these being represented by the numeral 103 in FIG. 8. This completed assembly, shown hidden, may be mounted on still a larger PCB or other substrate (not shown), one example being a "motherboard" of much larger size, should such a board be required. These components are shown hidden because these are enclosed within and thus behind a suitable housing 105 designed to accommodate the various electrical and other components which form part of system 101. PCB 85 may instead comprise such a "motherboard" in system 101 and thus include additional electrical assemblies, including additional printed circuit "cards" mounted thereon, such additional "cards" in turn also possibly including additional electronic components as part thereof. It is thus seen and understood that the electrical assemblies made in accordance with the unique teachings herein may be utilized in several various structures as part of a much larger system, such as information handling system 101. Further description is not believed necessary.

While there have been shown and described what are at present considered to be the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:

providing a first dielectric sub-layer including a low moisture absorptivity resin and having first and second opposing surfaces, said first dielectric sub-layer further including a plurality of fibers having a low coefficient of thermal expansion;

forming first and second circuitized layers on said first and second opposing surfaces of said first dielectric sub-layer, respectively;

positioning second and third dielectric sub-layers on said first and second circuitized layers, respectively, each of said second and third dielectric sub-layers also of a low moisture absorptivity resin, said second and third dielectric sub-layers not including continuous or semi-continuous fibers or the like as part thereof;

forming third and fourth circuitized layers on said second and third dielectric sub-layers, respectively; and forming a highly dense pattern of thru-holes which extend through said first, second and third sub-layers and said first second third and fourth circuitized layers.

2. The method of claim 1 wherein said forming of said highly dense pattern of thru-holes comprises forming each of said thru-holes with an aspect ratio of the thickness of said first, second and third dielectric sub-layers of said circuitized substrate to the diameter of said thru-holes within the range of from about 2:1 to about 20:1.

3. The method of claim 1 wherein said highly dense pattern of said thru-holes are provided within said first, second and third dielectric sub-layers using a laser.

4. The method of claim 1 further including electrically coupling at least one electrical component to said third circuitized layer.

* * * * *

UNITED STATES PATENT AND TRADEMARK OFFICE
CERTIFICATE OF CORRECTION

PATENT NO. : 7,416,972 B2  
APPLICATION NO. : 11/730942  
DATED : August 26, 2008  
INVENTOR(S) : Robert M. Japp, Irving Memis and Kostas I. Papathomas It is certified that error appears in the above-identified patent and that said Letters Patent is hereby corrected as shown below:

Title Page

Please change: (54) METHOD OF MAKING SAME LOW MOISTURE ABSORPTIVE CIRCUITIZED SUBSTRAVE WITH REDUCED THERMAL EXPANSION to: (54) METHOD OF MAKING SAME LOW MOISTURE ABSORPTIVE CIRCUITIZED SUBSTRATE WITH REDUCED THERMAL EXPANSION Signed and Sealed this Twenty-eighth Day of October, 2008

JON W. DUDAS  
*Director of the United States Patent and Trademark Office*

UNITED STATES PATENT AND TRADEMARK OFFICE
CERTIFICATE OF CORRECTION

PATENT NO. : 7,416,972 B2  Page 1 of 1
APPLICATION NO. : 11/730942
DATED : August 26, 2008
INVENTOR(S) : Robert M. Japp, Irving Memis and Kostas I. Papathomas It is certified that error appears in the above-identified patent and that said Letters Patent is hereby corrected as shown below:

Title Page

Please change: (54) and Column 1, lines 1-4    METHOD OF MAKING SAME LOW MOISTURE ABSORPTIVE CIRCUITIZED SUBSTRAVE WITH REDUCED THERMAL EXPANSION to:    (54) and Column 1, lines 1-4    METHOD OF MAKING SAME LOW MOISTURE ABSORPTIVE CIRCUITIZED SUBSTRATE WITH REDUCED THERMAL EXPANSION This certificate supersedes the Certificate of Correction issued October 28, 2008.

Signed and Sealed this

Eighteenth Day of November, 2008

JON W. DUDAS
*Director of the United States Patent and Trademark Office*